(12) United States Patent
Tran et al.

(10) Patent No.: US 6,400,229 B1
(45) Date of Patent: Jun. 4, 2002

(54) LOW NOISE, LOW DISTORTION RF AMPLIFIER TOPOLOGY

(75) Inventors: Kelvin T. Tran, Carson; Clifford Duong, Fountain Valley; Michael N. Farias, San Diego; Don C. Devendorf, Carlsbad; Lloyd F. Linder, Agoura Hills, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/790,796

(22) Filed: Feb. 22, 2001

(51) Int. Cl.$^7$ ................................................. H03F 1/22
(52) U.S. Cl. ......................................... 330/311; 330/98
(58) Field of Search ........................... 330/98, 99, 100, 330/311

(56) References Cited

U.S. PATENT DOCUMENTS

| | | | | |
|---|---|---|---|---|
| 5,623,230 A | * | 4/1997 | Goldthorp | 330/267 |
| 6,163,211 A | * | 12/2000 | Morrish | 330/98 |
| 6,218,906 B1 | * | 4/2001 | Lohninger | 330/311 |
| 6,246,290 B1 | * | 6/2001 | Morrish et al. | 330/311 |

* cited by examiner

*Primary Examiner*—Benny Lee
*Assistant Examiner*—Henry Choe
(74) *Attorney, Agent, or Firm*—Leonard A. Alkov; Glenn H. Lenzen, Jr.

(57) ABSTRACT

A low noise, low distortion radio frequency amplifier which includes a bootstrap design to minimize intermodulation distortion while simultaneously achieving low noise and wide bandwidth. In the illustrative embodiment, the invention includes a first circuit for receiving an input signal; a second circuit for amplifying the input signal using a transistor Q2; and a third circuit for regulating a rate of change of voltage across the transistor Q2 such that the rate of voltage change is zero. The third circuit includes a transistor Q3 connected to the transistor Q2 in cascode. In the specific illustrative embodiment, the third circuit further includes two diodes D1 and D2 used to modulate the voltage at the input of the transistor Q3 in proportion to the voltage modulation at the input of the transistor Q2. In the illustrative embodiment, the second circuit includes a transistor Q1 connected in cascade to the transistor Q2. In the specific illustrative embodiment, the invention further includes a fourth circuit for regulating a rate of change of voltage across the transistor Q1 such that the rate of voltage change is zero. The fourth circuit includes a transistor Q4 connected to the transistor Q1 in cascode. The two diodes D1 and D2 also connect the transistors Q1 and Q4 such that the voltage at the input of the transistor Q4 is modulated in proportion to the voltage modulation at the input of the transistor Q1.

62 Claims, 2 Drawing Sheets

LOW NOISE, LOW DISTORTION RF AMPLIFIER TOPOLOGY

BACKGROUND OF THE INVENTION

1. Field of the Invention

The present invention relates to electronic circuits and systems. More specifically, the present invention relates to radio frequency amplifiers used in communications systems.

2. Description of the Related Art

Signal integrity is a critical consideration in the design and operation of amplifier circuits, particularly when used in transmitters and receivers for communications systems. For a variety of applications, it is imperative that the output of the amplifier accurately tracks the input. Inevitably, noise and distortion introduce inaccuracies in the output signal, which will then be propagated throughout the rest of the system. In this connection, the term 'noise' refers to the thermal noise generated by the circuit, while 'distortion' refers to the nonlinearities produced by the circuit design such as harmonics or intermodulation products.

Currently, conventional low noise amplifiers are designed to keep the thermal noise level to a minimum by using larger transistors. The large signal currents in the larger transistors, however, inherently produce high intermodulation distortion, particularly at high (e.g., radio) frequencies. There is currently no method for simultaneously minimizing both noise and distortion in an RF amplifier.

Hence, a need remains in the art for an improved radio frequency amplifier design offering wider bandwidth, lower noise, and lower distortion.

SUMMARY OF THE INVENTION

The present invention uses a bootstrap design technique in a low noise radio frequency amplifier in order to achieve a wide bandwidth, low noise figure, and low distortion all at once.

In the illustrative embodiment, the invention includes a first circuit for receiving an input signal; a second circuit for amplifying the input signal using a transistor Q2; and a third circuit for regulating a rate of change of voltage across the transistor Q2 such that the rate of voltage change is zero. The third circuit includes a transistor Q3 connected to the transistor Q2 in cascode. In the specific illustrative embodiment, the third circuit further includes two diodes D1 and D2 used to modulate the voltage at the input of the transistor Q3 in proportion to the voltage modulation at the input of the transistor Q2. Thus, the rate of voltage change across the transistor Q2 is zero, and the high intermodulation distortion normally generated in a conventional low noise amplifier is eliminated. The transistor Q2 can then be enlarged to minimize thermal noise without reducing bandwidth or degrading distortion performance.

In the illustrative embodiment, the second circuit includes a transistor Q1 connected in cascade to the transistor Q2. The transistor Q1 buffers the input from the high current running from the transistor Q2. In the specific illustrative embodiment, the invention further includes a fourth circuit for regulating a rate of change of voltage across the transistor Q1 such that the rate of voltage change is zero. The fourth circuit includes a transistor Q4 connected to the transistor Q1 in cascode. The two diodes D1 and D2 also connect the transistors Q1 and Q4 such that the voltage at the input of the transistor Q4 is modulated in proportion to the voltage modulation at the input of the transistor Q1. Thus, the rate of voltage change across the transistor Q1 is zero, and the transistor Q1 can also be enlarged to minimize thermal noise without reducing bandwidth or degrading distortion performance.

The present invention provides a larger bandwidth, a lower noise figure and lower distortion than what has been achievable up to this point in time. These advantages are afforded by the fact that a bootstrap design is used to regulate the voltage excursions across the main noise-setting, distortion determining transistor Q2. The size of Q2 can then be enlarged to reduce noise without generating distortion. In addition, the bootstrap of the transistor Q1 allows its size to also be enlarged to reduce noise without degrading distortion performance.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications. it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
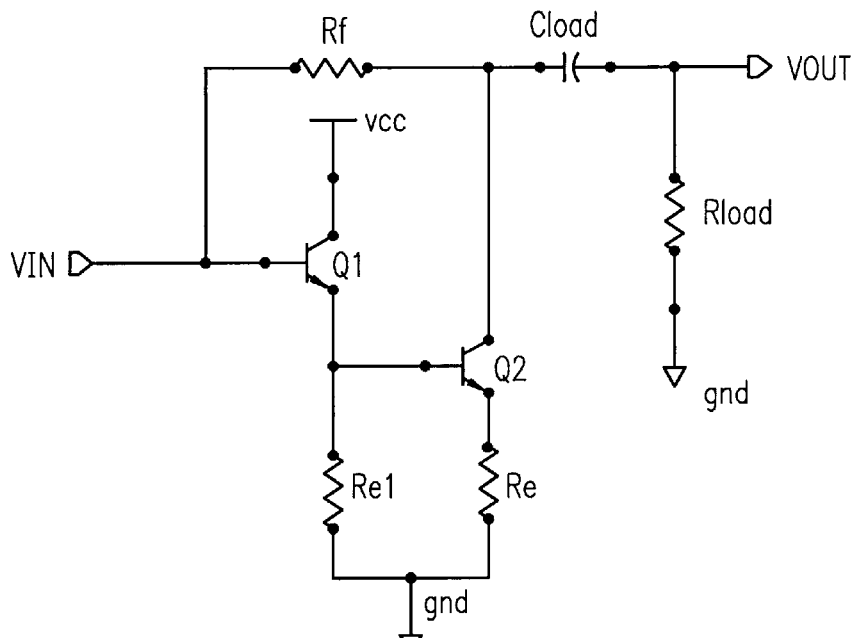
FIG. 1 is a simplified schematic diagram of a simple low noise amplifier such as that currently used in RF amplifiers of conventional design and construction.

FIG. 1 is a simplified schematic diagram of a simple low noise amplifier such as that currently used in RF amplifiers of conventional design and construction. The amplifier includes first and second transistors Q1 and Q2 connected in a common collector, common emitter cascade. The first transistor Q1 is in a common collector configuration, the second transistor Q2 is in a common emitter configuration, and the emitter of Q1 is connected to the base of Q2. The transistor Q2 serves as the primary amplifier of the circuit. The transconductance $g_m$ of Q2 sets the overall gain. The transistor Q1 acts as a buffer to the input from the high current running from the base of Q2. Each transistor Q1 and Q2 has an emitter resistor R1 and $R_e$, respectively. The collector of the first transistor Q1 is connected to a source of supply voltage $V_{cc}$. The collector of the second transistor Q2 is connected to the base of the first transistor Q1 via a feedback resistor $R_f$.

The low noise amplifier circuit of FIG. 1 minimizes thermal noise at the expense of higher intermodulation distortion. The dominant noise source from this topology is the base resistance of the transistors Q1 and Q2. Larger transistors Q1 and Q2 are used to minimize the value of the base resistance and its noise contribution. A larger transistor, however, gives rise to a larger collector-base capacitance. The second transistor Q2 is prone to the Miller effect, producing intermodulation distortion directly proportional to the collector-base capacitance.

Specifically, the intermodulation distortion is proportional to $\Delta i$, the signal current through the collector-base junction. The signal current $\Delta i$ is proportional to the collector-base capacitance ($C_{CB}$) in the manner described by the following equations:

$$\Delta i = C_{CB} d/dt(V_{CB}) = C_{CB} d/dt(V_B - V_C) \quad [1]$$

$$= C_{CB} d/dt(V_B - V_{out}) \quad [2]$$

$$\cong C_{CB} d/dt[V_{in} - (G * V_{in})] \quad [3]$$

$$= C_{CB}(1 - G) d/dt(V_{in}) \quad [4]$$

where $V_{CB}$ is the voltage across the collector-base junction, $V_B$ is the voltage at the base of Q2, $V_C$ is the voltage at the collector of Q2, $V_{in}$ is the input voltage, $V_{out}$ is the output voltage, and G is the overall voltage gain of the circuit. The maximum value of the signal current $\Delta i$ can be determined to be:

$$\Delta i|_{peak} = C_{CB}(1-G)V_{max}\omega, \quad [5]$$

where $V_{max}$ is the peak voltage of the input signal and w is the maximum frequency in the input signal. The Miller effect distortion is therefore proportional to the collector-base capacitance of Q2, the overall gain of the circuit, and the frequency of the input signal.

Thus, in the conventional low noise amplifier design of FIG. 1, the need for low noise leads to larger transistors Q1 and Q2, which gives rise to high intermodulation distortion due to the Miller effect. This severely band-limits the frequency response of the amplifier in addition to degrading the distortion performance.

Figure 2:
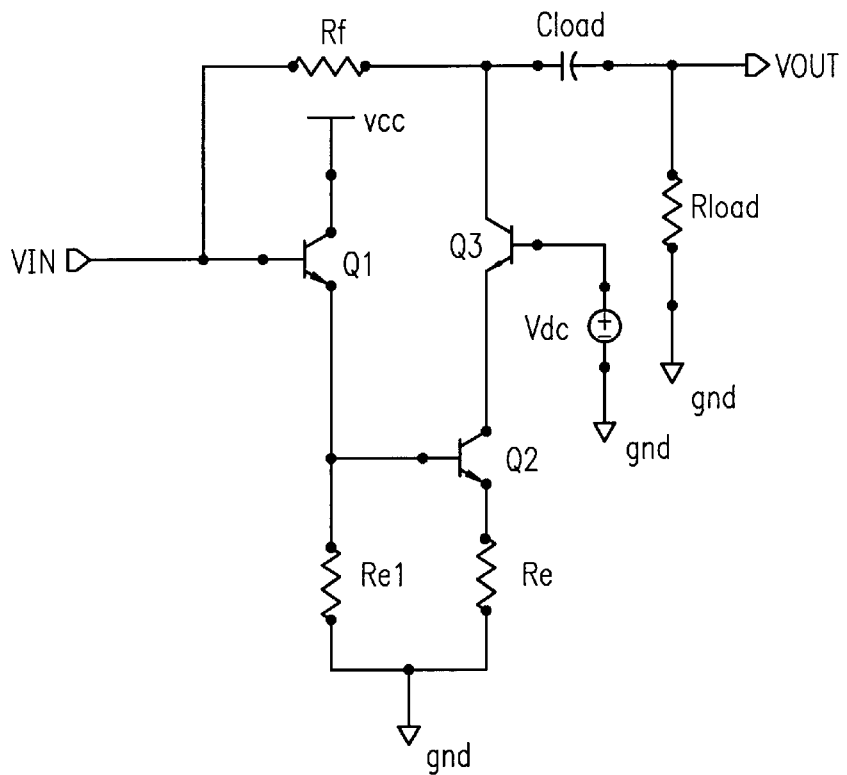
FIG. 2 is a simplified schematic diagram of an improved low noise amplifier which utilizes a bootstrap design in accordance with the teachings of the present invention.

FIG. 2 is a simplified schematic diagram of an improved low noise amplifier which utilizes a bootstrap design technique in accordance with the teachings of the present invention. The amplifier is similar to that of FIG. 1, except that a third transistor Q3 is connected in cascode to the second transistor Q2. The third transistor Q3 is in a common base configuration, and the collector of Q2 is connected to the emitter of Q3. The base of Q3 is connected to a voltage source $V_{dc}$. The collector of Q3 is connected to the base of Q1 by a feedback resistor $R_f$.

The improved low noise amplifier of FIG. 2 displays the characteristic of linear design with a low noise figure, lower distortion, and larger bandwidth all at once. The bootstrap configuration regulates the voltage excursions across the collector-base junction of the second transistor Q2. As can be seen from equation (1), if the rate of voltage change at the collector of Q2 is equal to the rate of voltage change at the base of Q2, then the signal current $\Delta i$ through the collector-base junction goes to zero, and there is no intermodulation distortion due to the Miller effect. If the voltage source $V_{dc}$ at the base of the third transistor Q3 is somehow tied to the voltage at the base of Q2, such that as the base of Q2 modulates, the base of Q3 modulates equally, then the rate of change of the voltage across the collector-base junction of Q2 will be zero. Then, the size of the second transistor Q2 can be increased to reduce noise, without adding any distortion.

Figure 3:
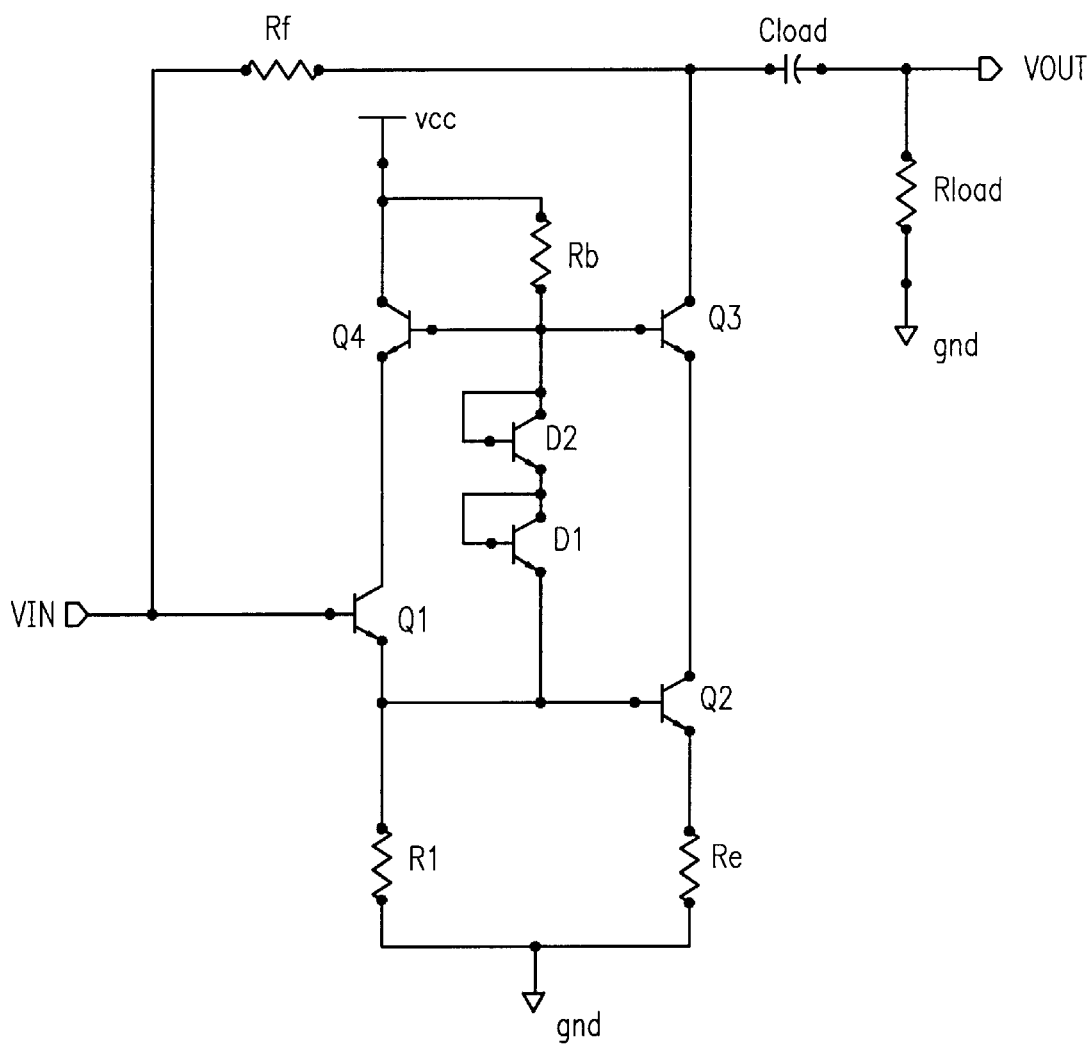
FIG. 3 is a simplified schematic diagram of the improved low noise amplifier with a specific embodiment of the bootstrap design in accordance with the teachings of the present invention.

FIG. 3 is a simplified schematic diagram of the improved low noise amplifier including a specific embodiment of the bootstrap design in accordance with the teachings of the present invention. The bootstrap circuitry of this design includes the third transistor Q3 which has an emitter connected to the collector of the second transistor Q2, as in FIG. 2. The base of the third transistor Q3 is connected to the base of the second transistor Q2 by two diodes D1 and D2. The base of Q3 is driven by a current source, which can be supplied by a voltage source $V_{cc}$ in series with a resistor $R_b$. The collector of Q3 is connected to the base of Q1 by a feedback resistor $R_f$.

The two diodes D1 and D2 shift the level of the input signal at the emitter of Q1 up to the base of Q3. Thus, the emitter of Q3 is bootstrapped with respect to the base of Q2, such that the rate of voltage change at the collector of Q2 is equal to the rate of voltage change at the base of Q2, and there is no intermodulation distortion due to the Miller effect.

Since the third transistor Q3 is connected in cascode with Q2, the signal current at the emitter of Q3 is approximately equal to the signal current at the collector of Q3. Thus, the signal current created in Q2 is passed to the output, and the overall gain of the circuit is the same as that of FIG. 1.

The improved low noise amplifier of FIG. 3 further includes a fourth transistor Q4 to bootstrap the collector of the first transistor Q1, such that the emitter of Q4 is connected to the collector of Q1. The base of Q4 is connected to the base of Q3, and the collector of Q4 is connected to the voltage source $V_{cc}$. Thus, in a manner similar to the second transistor Q2, the first transistor Q1 is also bootstrapped and its collector-base capacitance will not contribute any intermodulation distortion.

In practice, the rate of change of the voltage at the collector of Q2 may not be exactly equal to that at the base of Q2. Equation (1) would then be:

$$\Delta i = C_{CB}[d/dt(V_B) - d/dt(aV_B)] \quad [6]$$

$$\cong C_{CB}(1-a)d/dt(V_{in}) \quad [7]$$

where a is the voltage gain across the collector-base junction of Q2, and is determined from:

$$a = (g_m R_c)/[1+(g_m R_e)] \quad [8]$$

where $g_m$ is the transconductance of Q2.

As the term $g_m R_e$ gets much larger than 1, a approaches 1 and the distortion goes to zero. Since it is desirable to have a small value of $R_e$ as it directly adds to the system noise, $g_m$ must be made large enough to satisfy the requirement of $g_m R_e >> 1$. The resistor $R_e$ can be optimized to reduce noise without compromising distortion because the collector-base capacitance is bootstrapped. Also, since the base of Q3 is not in the signal path, its base resistance does not contribute to noise.

By comparing equation (7) with equation (4), it can be seen that the intermodulation distortion of FIG. 3 as compared to that of FIG. 1 is reduced by a factor of $(1-G)/(1-a)$. With typical values of G at 5 to 10, and a of 0.8 to 0.9, the distortion is thus reduced by a factor of 5 to 10.

Hence, the new topology of FIG. 3 minimizes the intermodulation distortion produced by the Miller effect, enabling the use of larger transistors Q1 and Q2 to minimize thermal noise without decreasing the overall gain or the bandwidth of the circuit.

Thus, the present invention has been described herein with reference to a particular embodiment for a particular application. Those having ordinary skill in the lift and access to the present teachings will recognize additional modifications, applications and embodiments within the scope thereof. For example, those skilled in the art will appreciate that for the circuit shown in FIG. 3, the NPN transistors may be interchanged with PNP transistors without departing from the scope of the present teachings. Further, the present invention is not limited to an implementation in bipolar technology. The present invention may be implemented in other transistor technologies without departing from the scope of the present teachings.

It is therefore intended by the appended claims to cover any and all such applications, modifications and embodiments within the scope of the present invention.

Accordingly, what is claimed is:

1. An amplifier comprising:
   first means for receiving an input signal;
   second means for amplifying said input signal, said second means including a transistor Q2; and
   third means for regulating a rate of change of voltage across said transistor Q2, said third means including a transistor Q3, and wherein said third means includes means for modulating an input terminal of said transistor Q3 in proportion to a modulation of an input terminal of said transistor Q2, wherein said means for modulating includes a source of current, including a voltage supply source $V_{cc}$ connected in series with a resistor $R_b$ connected to the input terminal of said transistor Q3.

2. The invention of claim 1 wherein the rate of voltage change is zero.

3. The invention of claim 1 wherein said means for modulating includes two diodes D1 and D2 connected in series between the input terminal of said transistor Q3 and the input terminal of said transistor Q2.

4. The intention of claim 1 wherein a first output terminal of said transistor Q2 is connected to a first output terminal of said transistor Q3.

5. The invention of claim 1 wherein a second output terminal of said transistor Q3 is connected to said first means through a resistor $R_f$.

6. The invention of claim 1 wherein a first output terminal of said transistor Q2 is connected to ground through a resistor $R_e$.

7. The invention of claim 1 wherein said second means includes a transistor Q1 connected in cascade to said transistor Q2.

8. The invention of claim 7 wherein an input terminal of said transistor Q1 is connected to said first means.

9. The invention of claim 7 wherein said amplifier further includes a fourth means for regulating a rate of change of voltage across said transistor Q1, said fourth means including a transistor Q4.

10. The invention of claim 9 wherein said rate of voltage change across the transistor Q1 is zero.

11. The invention of claim 9 wherein said fourth means includes a means for modulating an input terminal of said transistor Q4 in proportion to a modulation of the input terminal of said transistor Q1.

12. The invention of claim 11 wherein said means for modulation of the transistor Q4 includes the two diodes D1 and D2 connected in series between the input terminal of said transistor Q4 and a first output terminal of said transistor Q1.

13. The invention of claim 9 wherein a first output terminal of said transistor Q4 is connected to a voltage supply source $V_{cc}$.

14. The invention of claim 9 wherein a second output terminal of said transistor Q4 is connected to a second output terminal of said transistor Q1.

15. The invention of claim 9 wherein a first output terminal of said transistor Q1 is connected to ground through a resistor R1.

16. An amplifier comprising:
    first means for receiving an input signal
    second means for amplifying said input signal, said second means including a transistor Q2; and
    third means for regulating a rate of change of voltage across said transistor Q2, said third means including a transistor Q3, wherein said third means includes means for modulating an input terminal of said transistor Q3 in proportion to a modulation of an input terminal of said transistor Q2, wherein said means for modulating includes two diodes D1 and D2 connected in series between the input terminal of said transistor Q3 and the input terminal of said transistor Q2.

17. The invention of claim 16 wherein the rate of voltage change is zero.

18. The invention of claim 16 wherein said means for modulating includes a source of current connected to the input terminal of said transistor Q3.

19. The invention of claim 18 wherein said source of current includes a voltage supply $V_{cc}$ connected in series with a resistor $R_b$.

20. The invention of claim 16 wherein a first output terminal of said transistor Q2 is connected to a first output terminal of said transistor Q3.

21. The invention of claim 16 wherein a second output terminal of said transistor Q3 is connected to said first means through a resistor $R_f$.

22. The invention of claim 16 wherein said second means includes a transistor Q1 connected in cascade to said transistor Q2.

23. The invention of claim 22 wherein an input terminal of said transistor Q1 is connected to said first means.

24. The invention of claim 22 wherein said amplifier further includes a fourth means for regulating a rate of change of voltage across said transistor Q1, said fourth means including a transistor Q4.

25. The invention of claim 24 wherein said rate of voltage change across the transistor Q1 is zero.

26. The invention of claim 24 wherein said fourth means includes a means for modulating an input terminal of said transistor Q4 in proportion to a modulation of the input terminal of said transistor Q1.

27. The invention of claim 26 wherein said means for modulation of the transistor Q4 includes the two diodes D1 and D2 connected in series between the input terminal of said transistor Q4 and a first output terminal of said transistor Q1.

28. The invention of claim 24 wherein a first output terminal of said transistor Q4 is connected to a voltage supply source $V_{cc}$.

29. The invention of claim 24 wherein a second output terminal of said transistor Q4 is connected to a second output terminal of said transistor Q1.

30. The invention of claim 24 wherein a first output terminal of said transistor Q1 is connected to ground by through resistor R1.

31. An amplifier comprising:
    first means for receiving an input signal;
    second means for amplifying said input signal, said second means including a transistor Q2; and
    third means for regulating a rate of change of voltage across said transistor Q2, said third means including a transistor Q3, wherein a second output terminal of said transistor Q3 is connected to said first means through a resistor $R_f$.

32. The invention of claim 31 wherein the rate of voltage change is zero.

33. The invention of claim 31 wherein said third means includes means for modulating an input terminal of said transistor Q3 in proportion to a modulation of an input terminal of said transistor Q2.

34. The invention of claim 33 wherein said means for modulating includes a source of current connected to the input terminal of said transistor Q3.

35. The invention of claim 34 wherein said source of current includes a voltage supply source $V_{cc}$ connected in series with a resistor $R_b$.

36. The invention of claim 33 wherein said means for modulating includes two diodes D1 and D2 connected in series between the input terminal of said transistor Q3 and the input terminal of said transistor Q2.

37. The invention of claim 31 wherein a first output terminal of said transistor Q2 is connected to a first output terminal of said transistor Q3.

38. The invention of claim 31 wherein the first output terminal of said transistor Q2 is connected to ground through a resistor $R_e$.

39. The invention of claim 31 wherein said second means includes a transistor Q1 connected in cascade to said transistor Q2.

40. The invention of claim 39 wherein an input terminal of said transistor Q1 is connected to said first means.

41. The invention of claim 39 wherein said amplifier further includes a fourth means for regulating a rate of change of voltage across said transistor Q1, said fourth means including a transistor Q4.

42. The invention of claim 41 wherein said rate of voltage change across the transistor Q1 is zero.

43. The invention of claim 41 wherein said fourth means includes a means for modulating an input terminal of said transistor Q4 in proportion to a modulation of the input terminal of said transistor Q1.

44. The invention of claim 43 wherein said means for modulation of the transistor Q4 includes the two diodes D1 and D2 connected in series between the input terminal of said transistor Q4 and a first output terminal of said transistor Q1.

45. The invention of claim 41 wherein a first output terminal of said transistor Q4 is connected to a voltage supply source $V_{cc}$.

46. The invention of claim 41 wherein a second output terminal of said transistor is connected to a second output terminal of said transistor Q1.

47. The invention of claim 41 wherein a first output terminal of said transistor Q1 is connected to ground through a resistor R1.

48. An amplifier comprising:
first means for receiving an input signal;
second means for amplifying said input signal, said second means including a transistor Q2, wherein said second means includes a transistor Q1 connected in cascade to said transistor Q2;
third means for regulating a rate of change of voltage across said transistor Q2, said third means including a transistor Q3; and
fourth means for regulating a rate of change of voltage across said transistor Q1, said fourth means including a transistor Q4.

49. The invention of claim 48 wherein said rate of voltage change across the transistor Q1 is zero.

50. The invention of claim 48 wherein said fourth means includes a means for modulating an input terminal of said transistor Q4 in proportion to a modulation of the input terminal of said transistor Q1.

51. The invention of claim 50 wherein said means for modulation of the transistor Q4 includes the two diodes D1 and D2 connected in series between the input terminal of said transistor Q4 and a first output terminal of said transistor Q1.

52. The invention of claim 48 wherein a first output terminal of said transistor Q4 is connected to a voltage supply source $V_{cc}$.

53. The invention of claim 48 wherein a second output terminal of said transistor Q4 is connected to a second output terminal of said transistor Q1.

54. The invention of claim 48 wherein a first output terminal of said transistor Q1 is connected to ground by through a resistor R1.

55. The invention of claim 48 wherein the rate of voltage change is zero.

56. The invention of claim 48 wherein said third means includes means for modulating an input terminal of said transistor Q3 in proportion to a modulation of an input terminal of said transistor Q2.

57. The invention of claim 56 wherein said means for modulating includes a source of current connected to the input terminal of said transistor Q3.

58. The invention of claim 57 wherein said source of current includes a voltage supply source Vcc connected in series with a resistor $R_b$.

59. The invention of claim 56 wherein said means for modulating includes two diodes D1 and D2 connected in series between the input terminal of said transistor Q3 and the input terminal of said transistor Q2.

60. The invention of claim 48 wherein a first output terminal of said transistor Q2 is connected to a first output terminal of said transistor Q3.

61. The invention of claim 48 wherein a second output terminal of said transistor Q3 is connected to said first means through a resistor $R_f$.

62. The invention of claim 48 wherein an input terminal of said transistor Q1 is connected to said first means.

* * * * *